(12) United States Patent
Hori et al.

(10) Patent No.: US 8,927,873 B2
(45) Date of Patent: Jan. 6, 2015

(54) FIN-INTEGRATED SUBSTRATE AND MANUFACTURING METHOD OF FIN-INTEGRATED SUBSTRATE

(75) Inventors: Hisashi Hori, Shizuoka (JP); Hideyo Osanai, Tokyo (JP); Takayuki Takahashi, Tokyo (JP)

(73) Assignees: Dowa Metaltech Co., Ltd, Tokyo (JP); Nippon Light Metal Company, Ltd., Tokyo (JP)

( * ) Notice: Subject to any disclaimer, the term of this patent is extended or adjusted under 35 U.S.C. 154(b) by 68 days.

(21) Appl. No.: 13/521,922

(22) PCT Filed: Jan. 12, 2011

(86) PCT No.: PCT/JP2011/050381
§ 371 (c)(1),
(2), (4) Date: Jul. 12, 2012

(87) PCT Pub. No.: WO2011/087028
PCT Pub. Date: Jul. 21, 2011

(65) Prior Publication Data
US 2012/0279761 A1    Nov. 8, 2012

(30) Foreign Application Priority Data

Jan. 12, 2010  (JP) .................................. 2010-003630
Jan. 5, 2011   (JP) .................................. 2011-000386

(51) Int. Cl.
*H05K 1/00*       (2006.01)
*H01L 23/373*     (2006.01)
*H01L 23/473*     (2006.01)
*H01L 21/48*      (2006.01)

(52) U.S. Cl.
CPC .......... *H01L 23/473* (2013.01); *H01L 23/3735* (2013.01); *H01L 21/4878* (2013.01)
USPC .............................. 174/252; 174/260; 29/840

(58) Field of Classification Search
CPC .............. H01L 21/4878; H01L 23/473; H01L 23/3735; H01L 23/3731; H01L 23/46; H05K 1/0306; H05K 1/0204; H05K 3/0061; H05K 1/0203; H05K 2201/066; H05K 1/0201; H05K 1/181
USPC .......................... 174/250–268; 361/704–720; 257/704–724
See application file for complete search history.

(56) References Cited

U.S. PATENT DOCUMENTS 6,912,130 B2 *  6/2005 Osanai et al. ................. 361/699
7,215,545 B1    5/2007 Moghaddam et al.
(Continued)

FOREIGN PATENT DOCUMENTS

JP  2002-185175 A  6/2002
JP  2004-022914 A  1/2004
(Continued)

*Primary Examiner* — Ishwarbhai B Patel
(74) *Attorney, Agent, or Firm* — Rader, Fishman & Grauer PLLC

(57) ABSTRACT

There is provide a manufacturing method of a fin-integrated substrate capable of producing by simple process a fin-integrated substrate with heat radiating fins at fine pitches by a processing method in which warpage of a metal base plate and corrugation (wavy shape) of the heat radiating fins are suppressed. There is provided a manufacturing method of a fin-integrated substrate in which bonding of the metal circuit board to the ceramic substrate is performed by a molten metal bonding method, and formation of the plurality of heat radiating fins at a cut part that is a part of the metal base plate is performed by fixing by a jig to apply a tensile stress on a surface of the cut part where the heat radiating fins are to be formed, and performing grooving processing of forming a plurality of grooves by moving a multi-cutter composed of a plurality of stacked disc-shaped cutters, on the surface to which the tensile stress is applied, while rotating the multi-cutter.

23 Claims, 9 Drawing Sheets

(56) References Cited

U.S. PATENT DOCUMENTS

| | | | |
|---|---|---|---|
| 7,255,931 B2 * | 8/2007 | Osanai et al. | 428/650 |
| 8,081,465 B2 * | 12/2011 | Nishiura | 361/703 |
| 8,198,540 B2 * | 6/2012 | Kuromitsu et al. | 174/252 |
| 2007/0227697 A1 * | 10/2007 | Takahashi | 165/80.4 |
| 2008/0237847 A1 * | 10/2008 | Nakanishi et al. | 257/722 |

FOREIGN PATENT DOCUMENTS

| | | |
|---|---|---|
| JP | 2004-115337 A | 4/2004 |
| JP | 2006-245479 A | 9/2006 |
| JP | 2006-324647 A | 11/2006 |
| JP | 2008-135757 A | 6/2008 |
| JP | 2008-218938 A | 9/2008 |
| JP | 2009-056520 A | 3/2009 |

* cited by examiner

FIG. 12

| SAMPLE No. | CERAMIC SUBSTRATE | BASE PLATE MATERIAL | OFFSET PRESS | COOLING CONTAINER ATTACHMENT METHOD | EVALUATION | | | |
|---|---|---|---|---|---|---|---|---|
| | | | | | SHAPE EVALUATION | HEAT RADIATION PERFORMANCE EVALUATION | RELIABILITY EVALUATION | CORROSION RESISTANCE |
| SAMPLE11 | (1) AlN | (4) 99.9mass%Al | (6) WITHOUT PRESS | (8) BRAZING | FLATNESS<br>·BASE PLATE<br>100 μm OR LESS<br>·CIRCUIT PART<br>100 μm OR LESS | ABOUT 0.25 K/W | OK | 5000h<br>50%LLC<br>(75°C)<br>NO PITTING CORROSION |
| SAMPLE12 | | | | (9) SCREWING | | | | |
| SAMPLE13 | | | (7) WITH OFFSET PRESSING | (8) BRAZING | | | | |
| SAMPLE14 | | | | (9) SCREWING | | | | |
| SAMPLE15 | | (5) AlSiB ALLOY | (6) WITHOUT PRESS | (8) BRAZING | | | | |
| SAMPLE16 | | | | (9) SCREWING | | | | |
| SAMPLE17 | | | (7) WITH OFFSET PRESSING | (8) BRAZING | | | | |
| SAMPLE18 | | | | (9) SCREWING | | | | |
| SAMPLE19 | (2) Si₃N₄ | (4) 99.9mass%Al | (6) WITHOUT PRESS | (8) BRAZING | | | | |
| SAMPLE20 | | | | (9) SCREWING | | | | |
| SAMPLE21 | | | (7) WITH OFFSET PRESSING | (8) BRAZING | | | | |
| SAMPLE22 | | | | (9) SCREWING | | | | |
| SAMPLE23 | | (5) AlSiB ALLOY | (6) WITHOUT PRESS | (8) BRAZING | | | | |
| SAMPLE24 | | | | (9) SCREWING | | | | |
| SAMPLE25 | | | (7) WITH OFFSET PRESSING | (8) BRAZING | | | | |
| SAMPLE26 | | | | (9) SCREWING | | | | |
| SAMPLE27 | (3) Al₂O₃ | (4) 99.9mass%Al | (6) WITHOUT PRESS | (8) BRAZING | | NO EVALUATION | | |
| SAMPLE28 | | | | (9) SCREWING | | | | |
| SAMPLE29 | | (5) AlSiB ALLOY | (6) WITHOUT PRESS | (8) BRAZING | | | | |
| SAMPLE30 | | | | (9) SCREWING | | | | |

FIN-INTEGRATED SUBSTRATE AND MANUFACTURING METHOD OF FIN-INTEGRATED SUBSTRATE

TECHNICAL FIELD

The present invention relates to a metal-ceramic bonded substrate and, in particular, to a fin-integrated substrate in which a metal circuit board and a metal base plate each made of aluminum or an aluminum alloy are bonded to both surfaces of a ceramic substrate respectively, and plate-like heat radiating fins projecting from a surface of the metal base plate where the ceramic substrate is not bonded and extending at predetermined intervals from each other are integrally formed with the metal base plate, and a manufacturing method thereof.

BACKGROUND ART

In a conventional power module used to control a large current, for example, in an electric vehicle, an electric train, a machine tool or the like, a metal-ceramic insulating substrate is fixed on one surface of a metal plate or a composite material called a base plate by soldering, and an electronic component such as a semiconductor chip is fixed on the metal-ceramic insulating substrate by soldering. Further, a heat radiating fin or a cooling jacket made of metal is attached to another surface (a rear surface) of the base plate via a heat conductive grease by screwing or the like.

Since the soldering of the base plate, the electronic component and so on to the metal-ceramic insulating substrate is performed by heating, warpage of the base plate is likely to occur due to the difference in thermal expansion coefficient between bonded members in soldering. Further, the heat generated from the electronic component and so on is radiated to air, a cooling water or the like by the heat radiating fin or the cooling jacket via the metal-ceramic insulating substrate, the solder, and the base plate, so that if the aforementioned warpage of the base plate occurs, a clearance when the heat radiating fin or the cooling jacket is attached to the base plate increases to extremely decrease the heat radiation performance.

Hence, for example, Patent Document 1 discloses a metal-ceramic bonded substrate in which heat radiating fins (a reinforcing part) and a metal base plate are integrally formed and the warpage of the base plate that is the above-described problem can be made extremely small. Further, for example, Patent Document 2 and Patent Document 3 disclose a cooling jacket attached to the metal base plate, the heat radiating fins or the like to efficiently cool the heat generator.

Accordingly, by attaching the cooling jacket described in Patent Document 2, 3 to the metal-ceramic bonded substrate described in Patent Document 1, the warpage of the metal base plate is suppressed, resulting in a metal-ceramic bonded substrate with extremely high cooling efficiency.

On the other hand, Patent Document 4 discloses a grooving processing method of performing grooving processing on a work material block located on a base member (a metal base plate) in a heat sink or the like for cooling a semiconductor device and so on. The grooving processing method enables performance of grooving without occurrence of burr at the work piece block.

Patent Document 1: Japanese Patent Application Laid-open No. 2008-218938
Patent Document 2: Japanese Patent Application Laid-open No. 2006-324647
Patent Document 3: Japanese Patent Application Laid-open No. 2008-135757
Patent Document 4: Japanese Patent Application Laid-open No. 2009-56520

DISCLOSURE OF THE INVENTION

Problems to Be Solved by the Invention

However, in the metal-ceramic bonded substrate described in the above-described Patent Document 1, as the method of integrally forming the heat radiating fins in the metal base plate, the formation is performed using a mold and a mold at fine pitches is required particularly when forming the heat radiating fins in a fine shape, but the mold cannot be used in fact because of difficulty in release of the fins from the mold. It is also conceivable to form the heat radiating fins by forming the grooves one by one by machining that is conventionally general. However, it is difficult to produce the heat radiating fins at fine pitches with high dimensional accuracy and efficiency because of problems of the warpage due to heat generation during the processing and insufficient discharge of cutting chips during the processing.

On the other hand, the method of forming the heat radiating fins using the grooving processing method describe in the above-described Patent Document 4 is also conceivable. However, Patent Document 4 is intended for metal with high strength and hardness as the work material block. It was found from the investigation by the inventors that in the case of processing soft metal (with low hardness) such as aluminum and especially soft metal such as a casting material, when fixing using a jig a cut material (a work material block) being a processing object or the metal base plate on which the cut material is placed, there occur problems of bending of the metal base plate and occurrence of corrugation (wavy shape) in the heat radiating fins after the cutting processing. Furthermore, at cutting with a multi-cutter, a stress on the cut material (the work material block) or the metal base plate may occur to cause warpage.

Accordingly, even if the cooling jacket described in the above-described Patent Document 2 and Patent Document 3 is attached to the metal-ceramic bonded substrate described in the above-described Patent Document 1 or the cut material produced by the grooving processing described in Patent Document 4, it is difficult to obtain a liquid-cooled fin-integrated substrate with heat radiating fins at fine pitches.

Hence, in consideration of the above problems, an object of the present invention is to provide a manufacturing method of a fin-integrated substrate capable of producing by simple process a fin-integrated substrate with heat radiating fins at fine pitches by a processing method in which the warpage of a metal base plate and the deformation (occurrence of corrugation or the like) of the heat radiating fins are suppressed. Another object is to provide an air-cooled (gas-cooled) or liquid-cooled type fin-integrated substrate with heat radiating fins at fine pitches, which is excellent in strength, cooling efficiency, heat radiation performance, assembly ability of electronic component, thermal shock resistance, and corrosion resistance, using the manufacturing method.

Means for Solving the Problems

To achieve the above objects, according to the present invention, there is provided a fin-integrated substrate in which a metal circuit board made of aluminum or an aluminum alloy is bonded to one surface of a ceramic substrate, one surface of a metal base plate in a flat plate shape made of aluminum or an aluminum alloy is bonded to another surface of the ceramic substrate, and a plurality of heat radiating fins are formed integrally with the metal base plate in a manner to project from another surface of the metal base plate and to be arranged at predetermined intervals from each other, wherein a heat conductivity of the metal base plate is 170 W/(m·K) or more, a hardness of the metal base plate is a Vickers hardness of 20 to 40 (Hv), a width of the heat radiating fin is 0.2 to 2.0 mm, a width of a groove part formed between the plurality of heat radiating fins is 0.2 to 2.0 mm, and a depth of the groove part is 2 to 20 mm.

Here, a thickness of a portion of the metal base plate where the heat radiating fin is not formed may be 0.5 to 5 mm. The plurality of heat radiating fins may be formed to project in a direction almost vertical to the metal base plate and may be almost in parallel with each other. The metal base plate may be an aluminum alloy containing at least one element selected from among Si, Mg, Zn, Bi, and Sn. A crystal grain diameter of the metal base plate may be 5 mm or less. An arrangement of the plurality of heat radiating fins may be in a zigzag form.

A box-shaped liquid cooling type jacket to house the plurality of heat radiating fins therein may be provided, and the jacket may be bonded to the metal base plate. The jacket and tip portions of at least a part of the heat radiating fins may be bonded together.

Further, according to the present invention in another aspect, there is provided a manufacturing method of a fin-integrated substrate for manufacturing a fin-integrated substrate in which a metal circuit board made of aluminum or an aluminum alloy is bonded to one surface of a ceramic substrate, one surface of a metal base plate in a flat plate shape made of aluminum or an aluminum alloy is bonded to another surface of the ceramic substrate, and a plurality of heat radiating fins are formed integrally with the metal base plate in a manner to project from another surface of the metal base plate and to be arranged at predetermined intervals from each other, wherein bonding of the metal circuit board to the ceramic substrate is performed by a molten metal bonding method, and the plurality of heat radiating fins are formed at the metal base plate by fixing by a jig to apply a tensile stress on a surface thereof where the heat radiating fins are to be formed, and performing grooving processing of forming a plurality of grooves by moving a multi-cutter composed of a plurality of stacked disc-shaped cutters, on the surface to which the tensile stress is applied, while rotating the multi-cutter.

The metal circuit board may be configured in one body composed of a plate part and a block part projecting near a middle portion of the plate part, and a surface on the block part where the heat radiating fins are to be formed may be in a convex shape. A middle portion of the block part may be thicker than a peripheral portion of the block part. Rotation blades of the multi-cutter may be alternating blades and have a rake angle of 10° or more. A cutting speed of the multi-cutter may be 700 mm/min or more. The jig may be in a shape not in contact with the ceramic substrate, and may be disposed at a position where the jig does not interfere with deformation of the metal base plate in the grooving processing. The jig may be a vacuum-suction type, and a suction power thereof may be controllable. After the grooving processing, a box-shaped liquid cooling type jacket to house the heat radiating fins therein may be bonded onto the surface of the metal base plate where the heat radiating fins have been formed. The bonding of the metal base plate and the jacket may be brazing. Tip portions of at least a part of the heat radiating fins and the jacket may be bonded together. A part of the jacket where the heat radiating fin tip portions and the jacket are bonded together may be thin as compared to another part.

Effect of the Invention

According to the present invention, there is provided a manufacturing method of a fin-integrated substrate capable of producing by simple process a fin-integrated substrate with heat radiating fins at fine pitches by a processing method in which the warpage of a metal base plate and the deformation (occurrence of corrugation or the like) of the heat radiating fins are suppressed. Further, there can also be provided an air-cooled (gas-cooled) or liquid-cooled type fin-integrated substrate with heat radiating fins at fine pitches, which is excellent in strength, cooling efficiency, heat radiation performance, assembly ability of electronic component, thermal shock resistance, and corrosion resistance, using the manufacturing method.

BRIEF DESCRIPTION OF THE DRAWINGS

FIG. 12 is a table showing the results of the test used to evaluate corrosion resistance as described in paragraph 64, which involves checking pitting corrosion by flowing a 50% LLC (75° C.) for 5000 h.

BEST MODE FOR CARRYING OUT THE INVENTION

Figure 1:
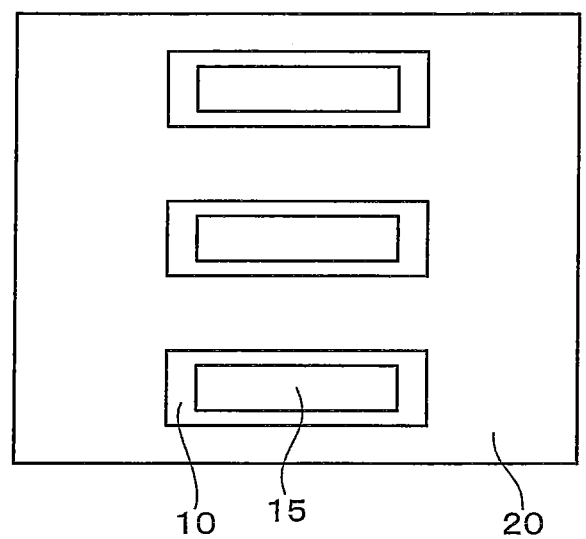
FIG. 1(a) is a plan view of a fin-integrated substrate 1.
FIG. 1(b) is a side sectional view of the fin-integrated substrate 1.
Figure 1:
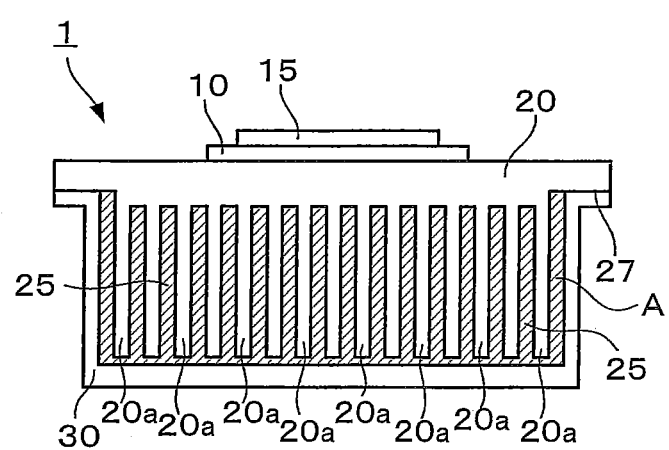

Hereinafter, an embodiment of the present invention will be descried referring to the drawings. Note that the components having substantially the same functional configurations in the specification and drawings are given the same numerals to omit overlapped description.

FIG. 1(a) is a plan view of a fin-integrated substrate 1 according an embodiment of the present invention, FIG. 1(b) is a side sectional view of the fin-integrated substrate 1 according to the embodiment of the present invention. As illustrated in FIG. 1, in the fin-integrated substrate 1, a metal circuit board 15 made of aluminum or an aluminum alloy is bonded to an upper surface (an upper part in FIG. 1(b)) of a ceramic substrate 10, and a metal base plate 20 made of aluminum or an aluminum alloy is bonded to a lower surface (a lower part in FIG. 1(b)) of the ceramic substrate 10. In the metal base plate 20, a plurality of heat radiating fins 20a are integrally formed with the metal base plate 20 in a manner to project from the lower surface of the metal base plate 20 almost vertical thereto and to be arranged at predetermined intervals almost in parallel with each other. In other words, groove parts 25 are formed in the gaps between the plurality of heat radiating fins 20a. Here, the heat radiating fins 20a are formed near the middle portion of the lower surface of the metal base plate 20, and a lower surface peripheral part 27 of the metal base plate 20 is in a flat plate shape.

Further, the fin-integrated substrate 1 illustrated in FIG. 1 is of a liquid cooled type, and has a box-shaped liquid cooling type jacket 30 molded to be able to house the heat radiating fins 20a therein attached to a bottom portion (on a lower part side in FIG. 1(b)) by bonding (for example, brazing). More specifically, a cooling liquid A supplied from a not-illustrated cooling liquid supply part flows inside the jacket 30 (a portion in which the heat radiating fins 20a are housed), so that the heat radiating fins 20a are cooled with the cooling liquid A.

In the fin-integrated substrate 1 configured as illustrated in FIG. 1, the metal base plate 20 preferably has a heat conductivity of 170 W/(m·K) or more, a hardness in a Vickers hardness Hv of 20 to 40, and a warpage of 100 μm or less. Further, the thickness of the peripheral part 27 is preferably 0.5 to 5 mm. Note that the "warpage" here means the difference in height between the central portion and the edge portion at the plane part of the metal base plate 20 on the side where the ceramic substrate is bonded, and it is assumed that the warpage when the metal base plate 20 is warped in a recessed shape is positive (+) and the warpage when the metal base plate 20 is warped in a projecting shape is negative (−).

The metal base plate serves to conduct the heat of an element generated on the circuit to the fins, and a material of the metal base plate preferably has a heat conductivity of 170 W/(m·K) or more. In particular, when a semiconductor element having a high heating value is mounted thereon, sufficient heat radiation may not be achieved if the heat conductivity is less than 170 W/(m·K). The heat conductivity is more preferably 180 W/(m·K) or more.

When Al or the Al alloy being the material of the metal base plate has a Vickers hardness over 40 (Hv), the heat cycle resistance (described later) significantly decreases. Further, when the Vickers hardness is less than 20 (Hv), the later-described machining of the fins becomes difficult, resulting in difficulty in keeping the shape and the dimension accuracy required for the fins. Therefore, the Vickers hardness of the metal base plate preferably ranges from 20 to 40 (Hv). In the range of the Vickers hardness from 20 to 40 (Hv), a fatigue failure due to the difference in linear expansion coefficient between ceramics and metal is less likely to occur even if 3000 times of heat cycle test (heat shock repeat test) of [keeping at −40° C. for 30 minutes→keeping at 25° C. for 10 minutes→keeping at 125° C. for 30 minutes→keeping at 25° C. for 10 minutes→] as one time are repeated.

When the thickness of the peripheral part exceeds 5 mm, melting and bonding by local heating such as a laser welding becomes difficult. With a thickness of less than 0.5 mm, breakage may occur due to fatigue caused by expansion and contraction when heating and cooling are repeated because of lack of mechanical strength.

The material of the metal base plate 20 is preferably aluminum and an aluminum alloy as described above, and more preferably an aluminum alloy containing at least one element selected from among Si, Mg, Zn, Bi, and Sn, and its crystal grain diameter is preferably 5 mm or less. When the crystal grain diameter exceeds 5 mm, the level difference and the deformation of the crystal boundary become large when the heat cycle is applied thereon.

Further, in the fin-integrated substrate 1, the width of the heat radiating fin 20a is 0.2 to 2.0 mm, and more preferably 0.3 to 1.5 mm, the width of the groove part 25 formed between the heat radiating fins 20a is 0.2 to 2.0 mm, more preferably 0.5 to 2.0 mm, and the depth of the groove part 25 is 2 to 20 mm, and more preferably 3 to 15 mm.

When the width of the heat radiating fin 20a is less than 0.2 mm, the heat transfer amount (the fin efficiency) decreases, whereas when the width exceeds 2.0 mm, the number of fins becomes too small. Further, the width of the fin is equal to or less than 0.2 mm, the metal base plate may be more likely to be deformed depending on the processing method of the fins in the case of material characteristics of the metal base plate of the present invention. When the width of the fin exceeds 2 mm, the width falls within the range where the fins can be manufactured even by casting through setting of the dimension of the mold.

When the width of the groove part 25 is less than 0.2 mm, the pressure loss becomes significantly large to decrease the cooling power, whereas when the width exceeds 2.0 mm, the flow velocity greatly decreases to decrease the cooling power. When the depth of the groove part 25 is less than 2 mm, the pressure loss becomes large, whereas when the depth exceeds 20 mm, the fin-integrated substrate 1 becomes thick. When the width of the groove part (the fin interval) exceeds 2 mm, the width falls within a range where the metal base plate can be manufactured even by casting through setting of the dimension of the mold. When the width of the groove part is made smaller than 0.2 mm, failures that the groove part is more likely to be clogged with cutting chips during processing and the like may occur.

When the depth of the groove part is less than 2 mm, the pressure loss becomes too large to decrease the heat exchange rate. When the depth of the groove part is larger than 20 mm, failures that the flow velocity becomes too low to decrease the heat exchange rate, that the groove part is more likely to be clogged with the cutting chips during processing and the like may occur.

In the fin-integrated substrate 1 configured as described above, a fin-integrated substrate 1 excellent in strength, cooling efficiency, and heat radiation performance can be obtained by defining the thickness and the material and composition of the metal base plate 20 and the width and the pitch of the heat radiating fins 20a and so on as described above, and by attaching the liquid cooling type jacket 30 such as to house the heat radiating fins 20a therein.

Figure 2:
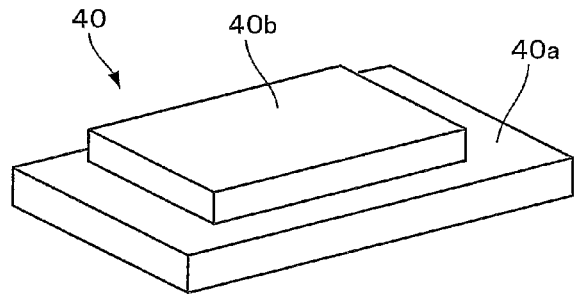
FIG. 2 is a perspective view of a cut material 40.
Figure 3:
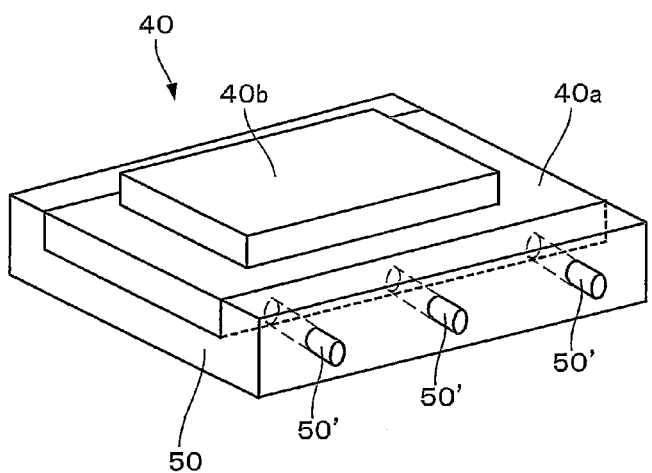
FIG. 3(a) is a first explanatory view of grooving processing.
FIG. 3(b) is a second explanatory view of grooving processing.
Figure 3:
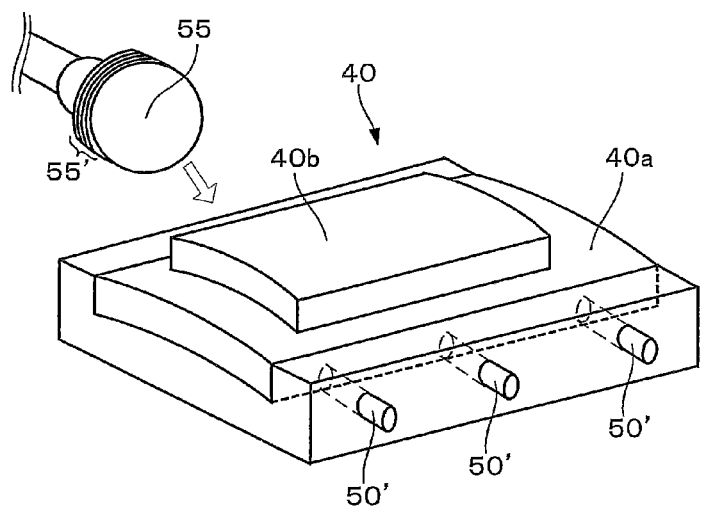

Next, a processing method to form the plurality of heat radiating fins 20a in the metal base plate 20 in the fin-integrated substrate 1 will be described. First, a metal circuit board made of Al or an Al alloy is bonded to one surface of a ceramic substrate, and a metal base plate (a cut material 40) made of Al or an Al alloy before the heat radiating fins are formed is bonded to the other surface of the ceramic substrate by the molten metal bonding method. FIG. 2 is a perspective view of the metal base plate 20 before the heat radiating fins 20a are formed, and the cut material 40 composed of a base part 40a and a cut part 40b. Here, the cut part 40b is a part which is processed into the heat radiating fins 20a. Further, FIG. 3 is an explanatory view when the cut material 40 is processed and subjected to grooving processing of forming the heat radiating fins 20a. Note that though FIG. 1 illustrates the heat radiating fins 20a formed at the lower part in the drawing (at the lower surface of the metal base plate 20), FIG. 2 and FIG. 3 illustrates the cut part 40b (the heat radiating fins 20a afterwards) directed upward in the drawings for explanation, and the description will be made below according to this arrangement in the drawings.

As illustrated in FIG. 2, the cut material 40 is composed of the base part 40a in an almost rectangular shape and the cut part 40b in an almost rectangular shape integrally formed with the base part 40a at the middle portion of the base part 40a. Note that though not illustrated in FIG. 2, the ceramic substrate 10 and the metal circuit board 15 are bonded to the lower surface of the base part 40a (the lower surface in FIG. 2). Note that the cut material 40 may be in a single almost rectangular shape. In this case, the formation of the edge part only needs to be implemented by cutting processing or the like before or after the processing of fins.

When forming the heat radiating fins 20a by executing the grooving processing on the cut part 40b, a jig 50 first fixes the cut material 40 as illustrated in FIG. 3(a), and then a multi-cutter 55 cuts the cut material 40 as illustrated in FIG. 3(b).

Here, the jig 50 is in a shape into which the base part 40a can be inserted as illustrated in FIG. 3(a), and the jig 50 is configured not to come into contact with the ceramic substrate 10 which is bonded to the lower surface of the cut material 40, and even when the cut part 40b is deformed due to the grooving processing, the deformed cut part 40b and the jig 50 do not come into contact with each other. The fixation of the cut material 40 by the jig 50 is performed to apply a tensile stress on the upper surface (the upper surface in FIG. 3) of the cut part 40b. More specifically, by inserting the base part 40a into the jig 50 and fixing the cut material 40 with the tip ends of screws 50' to apply pressure, for example, to the lower part of the side surface of the base part 40a as illustrated FIG. 3(a), the fixation is performed with the tensile stress applied on the upper surface of the cut part 40b.

At the cut material 40 fixed as described above, the multi-cutter 55 is pressed against the upper surface of the cut part 40b while being rotated as illustrated in FIG. 3(b) to perform grooving processing. Here, the multi-cutter 55 is configured such that a plurality of disc-shaped cutters 55' are stacked in parallel to each other, and the disc-shaped cutters 55' are rotated at high speed to cut an object. In the grooving processing, the multi-cutter 55 is pressed against the cut part 40b such that the rotation direction of the disc-shaped cutters 55' is in parallel with the longitudinal direction of the cut part 40b, and the multi-cutter 55 in the pressed state moves in the longitudinal direction of the cut part 40b to perform the processing. Note that the depth of the groove part 25 formed between the heat radiating fins 20a is preferably 2 to 20 mm as described above, and therefore the depth of cutting the cut part 40b by the multi-cutter 55 is preferably 2 to 20 mm in this embodiment.

Further, the rotation blades of the multi-cutter 55 are alternating blades and preferably have a rake angle set to 10° or more, and the cutting speed (the moving speed during cutting) of the multi-cutter 55 is preferably 700 mm/min or more. Defining the conditions for the grooving processing into the cut part 40b by the multi-cutter 55 as described above improves the discharge efficiency of the cutting chips and enables prevention of occurrence of corrugation (wavy shape) in the heat radiating fins 20a to be formed after the grooving processing. The cutting speed of the multi-cutter 55 is more preferably 1000 mm/min or more.

Performing the grooving processing under the processes and conditions described referring to FIG. 3 suppresses the deformation of the heat radiating fins 20a to be formed after the grooving processing. Further, performing the grooving processing in the state that the tensile stress is applied on the upper surface of the cut part 40b using the jig 50 makes it possible to suppress the occurrence of warpage of the whole cut material 40 (the metal base plate 20) after the cutting due to the residual stress caused by the cutting by the multi-cutter 55. In short, the metal base plate 20 (the fin-integrated substrate 1) in a desired shape will be accurately manufactured.

An example of the embodiment of the present invention has been described above, but the present invention is not limited to the illustrated embodiment. It should be understood that various changes and modifications are readily apparent to those skilled in the art within the scope of the spirit as set forth in claims, and those should also be covered by the technical scope of the present invention.

For example, though the grooving processing is performed in the state that the tensile stress is applied on the upper surface of the cut part 40b using the jig 50 in the above embodiment, the cut part 40b may be formed in a shape that the middle portion is thicker than the end portion because it is only necessary to suppress the occurrence of warpage of the whole cut material 40 (the metal base plate 20) after the cutting due to the residual stress caused by the cutting by the multi-cutter 55.

Figure 4:
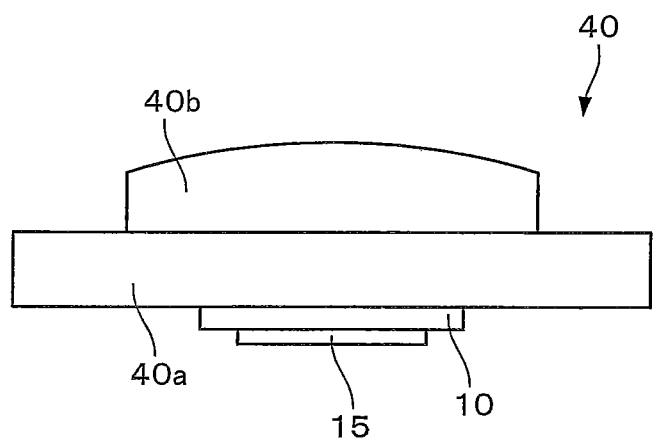
FIG. 4 is a side sectional view of the cut material 40 when the shape of a cut part 40b is made such that the middle portion is thicker than the end portion.

FIG. 4 is a side sectional view of the cut material 40 when the shape of the cut part 40b is made such that the middle portion is thicker than the end portion (the shape projecting upward in FIG. 4). Note that to the cut material 40, the ceramic substrate 10 and the metal circuit board 15 may be bonded to the lower surface (the surface at the lower part in FIG. 4) of the base part 40a during the grooving processing.

By forming the shape of the cut part 40b such that the middle portion is thicker than the end portion as illustrated in FIG. 4, the shape of the cut part 40b after the grooving processing becomes flat by the residual stress caused by the cutting after the grooving processing (cutting) by the multi-cutter 55 is performed, whereby the metal base plate 20 (the fin-integrated substrate 1) in the desired shape is manufactured. Note that for the difference in thickness between the middle portion and the end portion when the cut part 40b is formed in advance in the shape that the middle portion is thicker than the end portion, a preferable numerical value may be obtained by experimentally performing the grooving processing as necessary. Note that when the cut material is subjected to fin processing, the depth of the groove at the middle portion becomes large. In other words, the height of the fin becomes large, but the tip of the fin at this portion may be bonded with the jacket at a subsequent process.

Figure 5:
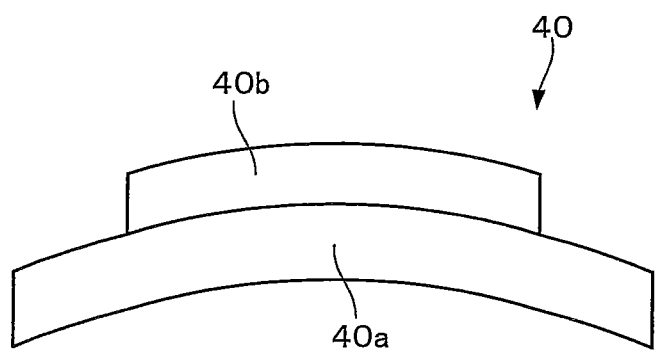
FIG. 5 is a side sectional view of the cut material 40 when the whole cut material 40 is formed in a warped shape.

Further, to suppress the occurrence of warpage of the whole cut material 40 (the metal base plate 20) after the cutting due to the residual stress caused by the cutting by the multi-cutter 55, the whole cut material 40 may be formed in advance in a warped shape before the grooving processing. FIG. 5 is a side sectional view of the cut material 40 when the whole cut material 40 is warped (a convex shape upward in FIG. 5).

By forming the whole cut material 40 in a warped shape in advance as illustrated in FIG. 5, the shape of the whole cut material 40 including the cut part 40b after the grooving processing becomes flat by the residual stress caused by the cutting and its change after the grooving processing (cutting) by the multi-cutter 55 is performed, whereby the metal base plate 20 (the fin-integrated substrate 1) in the desired shape is manufactured.

Figure 6:
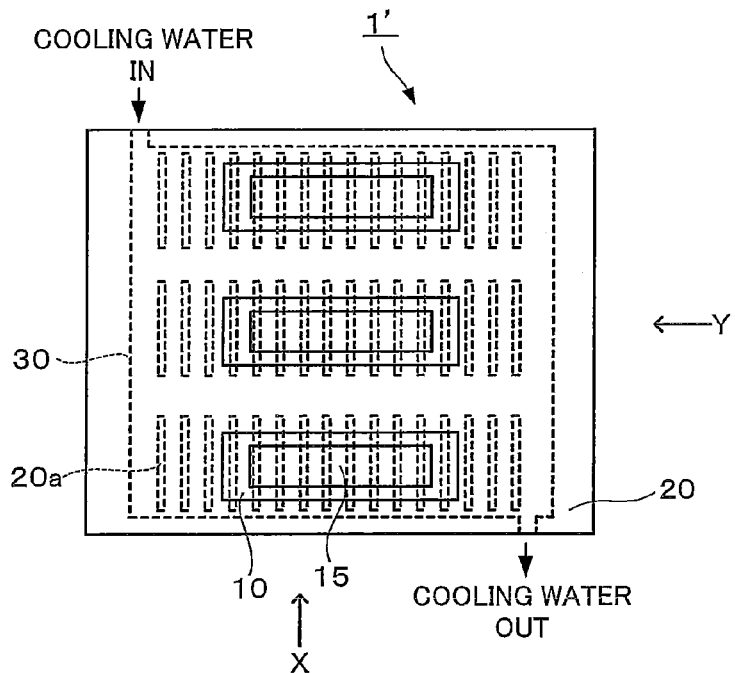
FIG. 6(a) is a plan view of a fin-integrated substrates 1'.
FIG. 6(b) is a side sectional view of the fin-integrated substrates 1' as seen from an X-direction in FIG. 6(a).
FIG. 6(c) is a side sectional view of the fin-integrated substrates 1' as seen from a Y-direction in FIG. 6(a).
Figure 6:
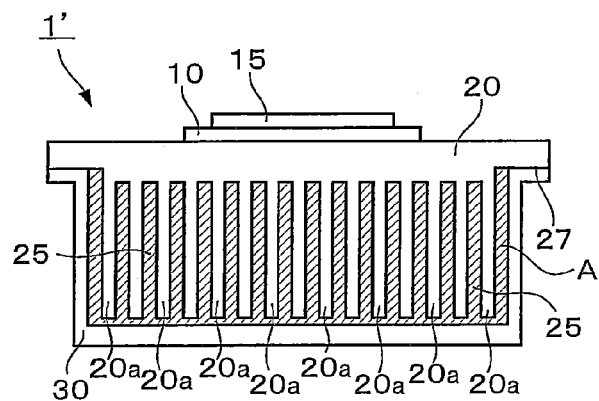
Figure 6:
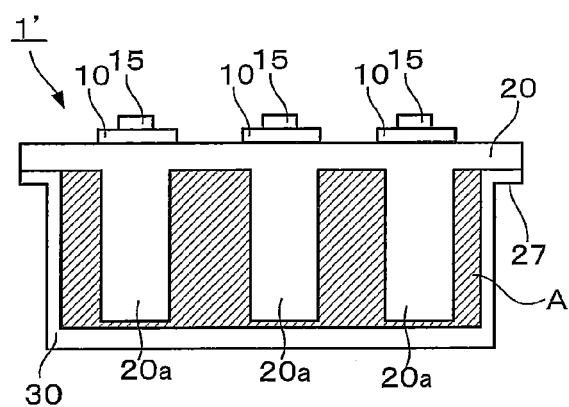

Further, though the configuration that the plurality of heat radiating fins 20a are integrally formed at one position of the middle portion of the lower part (the surface at the lower part illustrated in FIG. 1) of the metal base plate 20 as illustrated in FIG. 1, the present invention is not always limited to this configuration. The present invention may be configured such that a plurality of heat radiating fins 20a are formed at each of a plurality of positions at the lower part of the metal base plate 20 as illustrated in FIG. 6. Furthermore, it is also conceivable that a plurality of heat radiating fins 20a are integrally formed at a plurality of positions in a zigzag arrangement as seen from the lower part of the metal base plate 20 as illustrated in FIG. 7.

Figure 7:
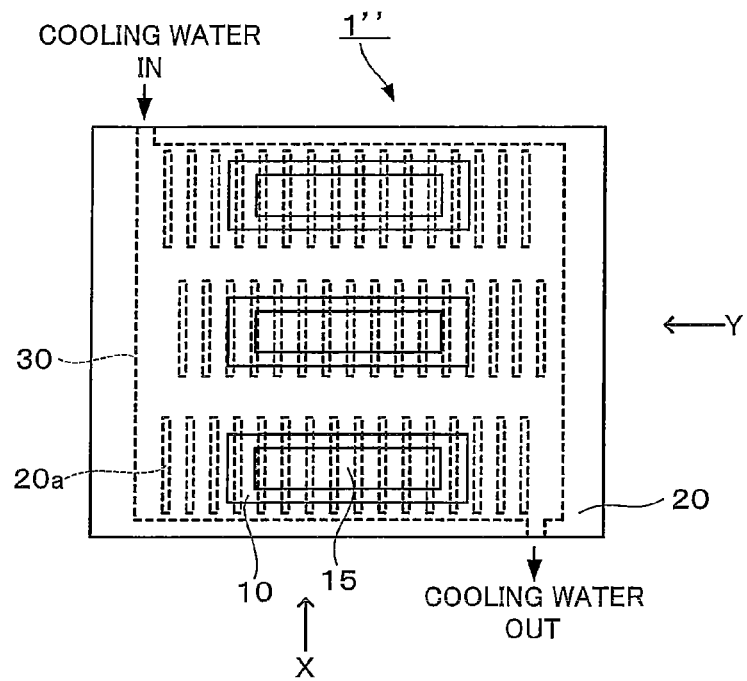
FIG. 7(a) is a plan view of a fin-integrated substrates 1".
FIG. 7(b) is a side sectional view of the fin-integrated substrates 1" as seen from an X-direction in FIG. 7(a).
FIG. 7(c) is a side sectional view of the fin-integrated substrates 1" as seen from a Y-direction in FIG. 7(a).
Figure 7:
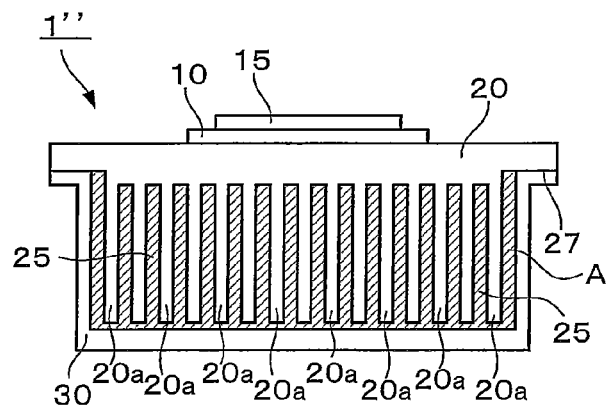
Figure 7:
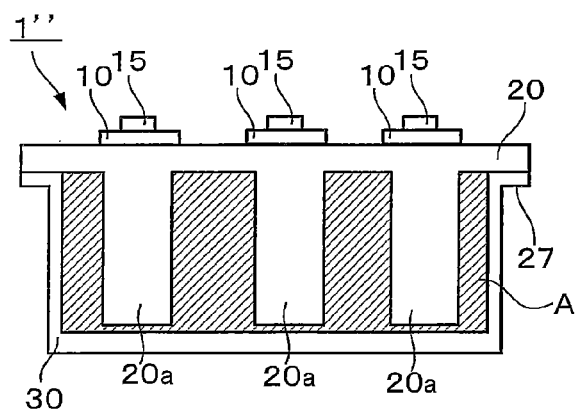

FIGS. 6 and 7 are explanatory views of a fin-integrated substrate 1' having a configuration that the plurality of heat radiating fins 20a are integrally formed at the plurality of positions at the lower part of the metal base plate 20, and a fin-integrated substrate 1" having a configuration that the plurality of heat radiating fins 20a are integrally formed at the plurality of positions in the zigzag arrangement at the lower part of the metal base plate 20. Here, FIG. 6(a) and FIG. 7(a) are plan views of the fin-integrated substrates 1' and 1", FIG. 6(b) and FIG. 7(b) are side sectional views as seen from an X-direction in FIG. 6(a) and FIG. 7(a) (the lower direction in FIG. 6(a) and FIG. 7(a)), and FIG. 6(c) and FIG. 7(c) are side sectional views as seen from a Y-direction in FIG. 6(a) and FIG. 7(a) (the right direction in FIG. 6(a) and FIG. 7(a)). Further, the heat radiating fins 20a formed on the lower surface of the metal base plate 20 are illustrated with broken lines for explanation in FIG. 6(a) and FIG. 7(a). Note that in the fin-integrated substrates 1' and 1", the heat radiating fins 20a are formed in three rows as seen in the X-direction in FIG. 6(a) and FIG. 7(a), which are regarded as a first row, a second row, and a third row from the front side as seen in the X-direction (the lower side on paper plane in FIG. 6, FIG. 7).

As illustrated in FIG. 7(a), the a plurality of heat radiating fins 20a are formed at the plurality of positions in the zigzag arrangement as seen from at the lower part of the metal base plate 20 in the fin-integrated substrate 1". More specifically, when the fin-integrated substrate 1" is seen from the X-direction (the lower direction in FIG. 7(a)), the heat radiating fins 20a in the second row are arranged to be viewed through between the heat radiating fins 20a in the first row. Further, the heat radiating fins 20a in the first row and the heat radiating fins 20a in the third row may be arranged to be viewed overlapped with each other as seen from the X-direction.

Further, the plurality of heat radiating fins may be discontinuously formed on the metal base plate and, for example, may be formed respectively at positions on the opposite surfaces of the metal base plate corresponding to the metal circuit board. Note that when the heat radiating fins 20a are formed at the plurality of positions, the jacket 30 may be attached to each of them. By integrally forming the plurality of heat radiating fins 20a at the plurality of positions at the lower part of the metal base plate 20 in this manner, a fin-integrated substrate 1 excellent in strength, cooling efficiency, and heat radiation performance is manufactured.

Further, though attachment of the liquid cooling type jacket 30 to house the heat radiating fins 20a therein as illustrated in FIG. 1 has been described in the above embodiment, it is also conceivable that at least a part of the tip portions of the heat radiating fins 20a (the lower end portions of the heat radiating fins 20a in FIG. 1) are bonded to the jacket 30 in this event. This realizes the reduction in transient heat resistance in the fin-integrated substrate 1 to stabilize the heat radiation performance. It is also possible to suppress the shape change such as bulging of the bottom surface of the jacket due to the pressure of the cooling liquid. Note that the fin-integrated substrate 1 may be used with air cooling (gas cooling) without bonding the liquid cooling type jacket thereto.

EXAMPLES

Example 1

Verification by simulation was carried out about the difference in temperature change of the heat generating element due to the difference in base thickness on four kinds of metal base plates (thicknesses of 1.0 mm, 3.0 mm, 5.0 mm, 10.0 mm), in which the heat generating elements were placed on the upper surfaces under the same condition only with the base thickness varied, as examples of the present invention.

Figure 8:
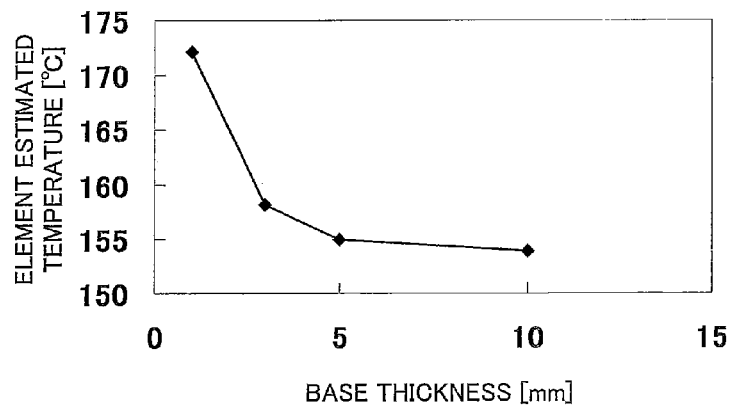
FIG. 8 is a graph representing the differences in temperature of a heat generating element in a non-steady state when the heat generating elements generated heat under the same condition (the same input heat quantity) on the metal base plates with the four kinds of thicknesses.

FIG. 8 illustrates a graph representing the differences in temperature of the heat generating element in a non-steady state when the heat generating elements generated heat under the same condition (the same input heat quantity) on the metal base plates with the above-described four kinds of thicknesses.

As illustrated in FIG. 8, it was found that there was a difference between the temperatures of the heat generating elements on the metal base plates with thicknesses of 1.0 mm and 3.0 mm and the temperatures of the heat generating elements on the metal base plates with thicknesses of 5.0 mm and 10.0 mm, and the cooling efficiency was more excellent when using the metal base plate with a thickness of 5.0 mm or more. It was found from FIG. 8 and the required characteristics such as the heat radiation performance, the strength and so on that the optimal thickness of the metal base plate was 3.0 to 5.0 mm. It was estimated from the simulation result that the optimal width of the heat radiating fin 20a at that time was 0.7 mm, the optimal width of the groove part 25 was 1 to 5 mm, and the optimal depth of the groove part 25 was 3.5 mm. In this event, when the thickness of the metal base plate was 5.0 mm, the estimated temperature of the element was expected to decrease by about 9% as compared to the thickness of 1.0 mm.

Example 2

Figure 9:
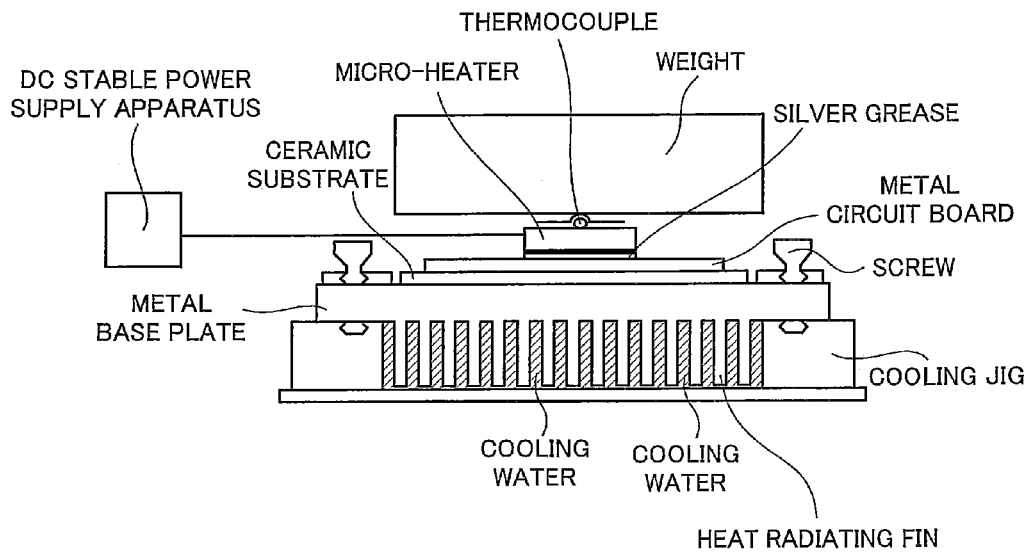
FIG. 9 is an explanatory view (a sectional view) of the configuration of an apparatus used in an examples 2 to 4.
Figure 10:
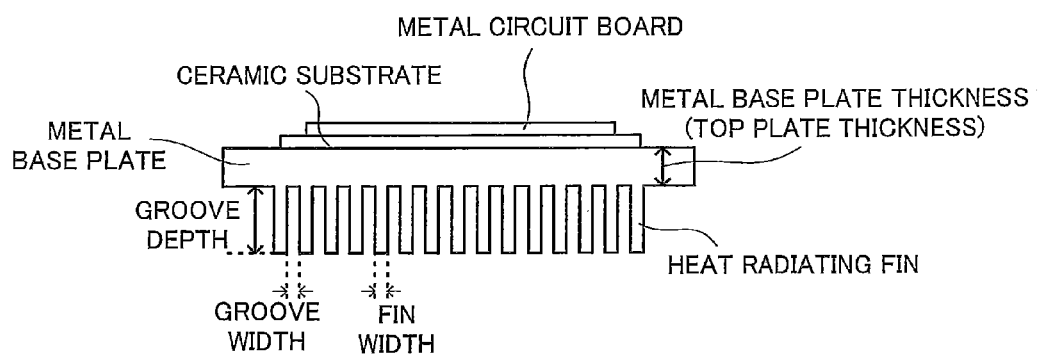
FIG. 10 is an enlarged view of a metal base plate, a ceramic substrate, and a metal circuit board in FIG. 9.

Next, fin-integrated substrates in samples 1 to 5 were created by the above-described method and their heat characteristics were measured. Here, the used apparatus is illustrated in FIG. 9, and FIG. 10 illustrates the metal base plate, the ceramic substrate, and the metal circuit board extracted from FIG. 9. A metal circuit board of 31 mm long×31 mm wide×0.6 mm thick was bonded to one surface of an AlN substrate of 35 mm long×35 mm wide×0.6 mm thick, and a metal base plate having a thickness not including the height of the fin (a top plate thickness) of 1 mm and 69.5 mm long×69.5 mm wide was formed on the other surface of the AlN substrate. The shape of the fin integrated with the top plate is described below. Note that the groove depth and the fin height are the same dimension.

The material of the metal base plate was Al and had a Vickers hardness of 21 (Hv).

The fin shape of the sample in this event was as follows. There was no generation of corrugation of the fin and the warpage amount of the metal base plate was 100 μm or less.

A box-shaped water cooling jacket was joined to the metal base plate using screws in a manner to prevent leakage of the cooling liquid and cooling water at 15° C. was passed therethrough.

The evaluation of the heat radiation performance was performed by bringing a micro-heater of 5 mm long×5 mm wide into contact with the circuit board surface via a silver grease (9 W/(m·K)) with a thickness of 10 μm. Further, a thermocouple was brought into contact with the middle portion of the micro-heater to be able to measure the temperature. Note that the thermocouple was fixed by a weight. In this state, the micro-heater was made to generate heat at 300 W and the temperature rise was measured. The results are as follows and show that the samples have sufficient heat radiation performance.

(Sample Shape)

|  | groove width mm | fin width mm | groove depth mm | number of grooves | surface are of fin mm² |
|---|---|---|---|---|---|
| Sample 1: | 0.8 | 0.8 | 6 | 19 | 7,980 |
| Sample 2: | 1 | 0.6 | 5 | 21 | 7,350 |
| Sample 3: | 1 | 0.6 | 6 | 21 | 8,820 |
| Sample 4: | 1 | 0.6 | 7 | 21 | 10,290 |
| Sample 5: | 1 | 0.4 | 7 | 24 | 11,760 |

(Heat Radiation Performance Measurement Result 1)

|  | saturation heat resistance (° C.) | transient heat resistance (° C./sec) |
|---|---|---|
| Sample 1: | 58.2 | 58.0 |
| Sample 2: | 57.0 | 58.1 |
| Sample 3: | 56.9 | 58.0 |
| Sample 4: | 56.8 | 58.4 |
| Sample 5: | 57.6 | 57.7 |

Saturation heat resistance was obtained by measuring the temperature after a lapse of 2 minutes after power was applied to the micro-heater.

Transient heat resistance was obtained by calculating the inclination of the temperature rise for 0.1 to 0.4 seconds with power applied to the micro-heater.

Example 3

For the measurement of the transient heat resistance, samples were created as in the example 2 except that power was applied to the micro-heater and the inclination of the temperature rise for 0.05 to 0.15 seconds was calculated, and evaluated. The results are as follows and show that the samples have sufficient heat radiation performance.

From the results, the heat resistance was about 4.5 (K/W).

(Sample Shape)

|  | groove width mm | fin width mm | groove depth mm | number of grooves | surface are of fin mm² |
|---|---|---|---|---|---|
| Sample 6: | 0.8 | 0.8 | 6 | 19 | 7,980 |
| Sample 7: | 1 | 0.4 | 7 | 24 | 11,760 |

(Heat Radiation Performance Measurement Result 1)

|  | saturation heat resistance (° C.) | transient heat resistance (° C./sec) |
|---|---|---|
| Sample 6: | 61.3 | 76.2 |
| Sample 7: | 62.3 | 80.1 |

Example 4

The metal base plates were bonded by the same method as that in the example 2, and the fin was processed using the multi-cutter. The processing speed in this event was set to 400 mm/min, 700 mm/min, and 1200 mm/min. When the processing speed (the feed speed of the cutter) was 400 mm/min, corrugation occurred in the fin to fail to obtain an excellent shape. At 700 mm/min and 1200 mm/min, excellent shapes were able to be obtained.

Example 5

Three ceramic substrates of 65 mm×35 mm were placed on carbon molds of 90 mm×155 mm. The three kinds of ceramic substrates (1) made of AlN with a heat conductivity of 170 W/(m·K) and a thickness of 0.635 mm, (2) made of $Si_3N_4$ with a heat conductivity of 70 W/(m·K) and a thickness of 0.32 mm, and (3) made of $Al_2O_3$ with a heat conductivity of 20 W/(m·K) and a thickness of 0.38 mm were placed on the carbon molds. The carbon molds were thrown into a furnace in a nitrogen atmosphere at 630° C. In the carbon mold, voids (spaces) for a circuit part, a base plate part, and a fin block part (a taper at the outer periphery of 2°) were provided in advance, and molten Al or Al alloy was poured into the voids and bonded and hardened. The materials of molten Al or Al alloy were two kinds: (4) pure aluminum (Al: 99.9 mass % or more) with a heat conductivity of 210 W/(m·K) and a Vickers hardness of 24 as Al, and (5) an Al-0.5 mass % Si-0.05 mass % B alloy with a heat conductivity of 190 W/(m·K) and a Vickers hardness of 28 as the Al alloy.

Next, machining of the heat radiating fins was performed. The fin width was set to 1 mm, the width of the groove part was set to 0.9 mm, the processing pitch was set to 1.9 mm, and the depth was set to 6 mm. A high-speed metal saw having 38 blades with a straight blade edge having a thickness of 0.9 mm was used at a number of rotations of 5000 rpm and a cutting speed of 1200 mm/min. The heat radiating fins were machined by one pass and degreased after the machining. In this event, there was no corrugation occurred in the formed fins in any sample. Thereafter, the fins were subjected to two patterns of pressing: (6) without offset pressing and (7) with offset pressing. For (7), a mold in a skewer shape was used, only the fins in every other row were bent and offset into the zigzag arrangement.

Further, a UV-curable resist ink in a circuit pattern shape was screen-printed at the circuit part, an unrequired portion in the circuit part was removed after the UV curing by etching with a ferric chloride solution, and the resist ink was peeled off to form a circuit pattern. Then, a double zincate treatment was performed such that the liquid was brought into contact with only a circuit pattern aluminum part, and electric Ni plating was performed to achieve an average film thickness of 5 μm.

By the formation by the above method, the flatness of the base plate was within 100 μm and the flatness of the circuit part was within 100 μm in any substrate.

Furthermore, attachment of the cooling case was performed by the following two methods. (8) An Al—Si—Mg based brazing material was used to braze a cooling case made of A1050 at 600° C. in an air atmosphere. (9) A cooling case made of A1050 was screwed to the integrated substrate via an O-ring.

For the fin-integrated substrates manufactured as described above, the heat radiation performance, the reliability and the corrosion resistance were evaluated.

For the evaluation of the heat radiation performance, the saturation heat resistance was measured by flowing a cooling water at 25° C. at 10 L/min and placing a heater regarded as an element on the circuit pattern. The saturation heat resistance was about 0.25 K/W in the samples of the ceramic substrates (1), (2) in any combination of the material of the Al molten metal (4) or (5), the presence or absence of the offset pressing (6) or (7), and the attachment method of the cooling case (8) or (9).

For the evaluation of the reliability, a liquid tank (liquid phase) heat cycle test of keeping at −40° C. for 5 minutes and keeping at 125° C. for 5 minutes as one cycle was carried out. The samples of the ceramic substrates (1), (2) had no crack in the ceramic after 3000 times of the liquid tank heat cycle test, and passed the withstanding voltage test at an AC 9 kV with its front and rear surfaces immersed in oil. The sample of the ceramic substrate (3) had no crack in the ceramic after 300 times of the liquid tank heat cycle test, and passed the withstanding voltage test at an AC 5 kV with its front and rear surfaces immersed in oil. Further, in any type, the fatigue failure of aluminum under the ceramic after 3000 times of the liquid tank heat cycle existed at 2 mm or lower from the creepage surface.

For the evaluation of the corrosion resistance, pitting corrosion was checked by flowing a 50% LLC (75° C.) for 5000 h, but the pitting corrosion was not confirmed in all types. The above results are presented in FIG. 12.

Example 6

A test piece of an MN ceramic with a size of 30 mm×30 mm×0.64 mm as a ceramic substrate, and aluminum with a size of a base part of 70 mm×70 mm×7 mm as a metal base plate (a cut material composed of a base part in an almost rectangular shape and a cut part in an almost rectangular shape integrally formed with the base part at the middle portion of the base part) and a cut part of 60 mm×60 mm×6 mm was created by the casting method. Further, a test piece in the same shape as the above-described test piece except that the metal base plate was composed of only the base part (without the cut part) was created in the same method as the above-described casting method.

These test pieces were subjected to fin processing by the respective clamping methods in samples 31, 32 being examples of the present invention and comparative examples 1, 2 described below. The fin width was set to 1 mm, and the width of the groove part was set to 0.9 mm, the processing pitch was set to 1.9 mm, and the depth was set to 6 mm. A high-speed metal saw having 35 blades with a straight blade edge having a thickness of 0.9 mm was used to process the heat radiating fins at a number of rotations of 5000 rpm and a cutting speed of 1200 mm/min. Note that the test pieces each composed of the cut part and the base part were used for the fin processing in the samples 31, 32 and comparative example 2, and the test piece composed of only the base part was used for the fin processing in the comparative example 1.

Figure 11:
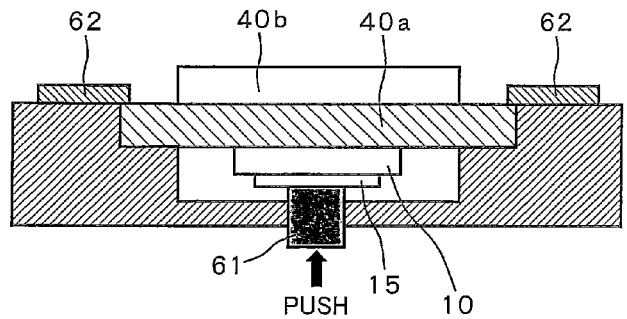
FIG. 11(a) is a sectional view explaining clamping methods of an example 6.
FIG. 11(b) is a second sectional view explaining clamping methods of an example 6.
FIG. 11(c) is a third sectional view explaining clamping methods of an example 6.
FIG. 11(d) is a fourth sectional view explaining clamping methods of an example 6.
Figure 11:
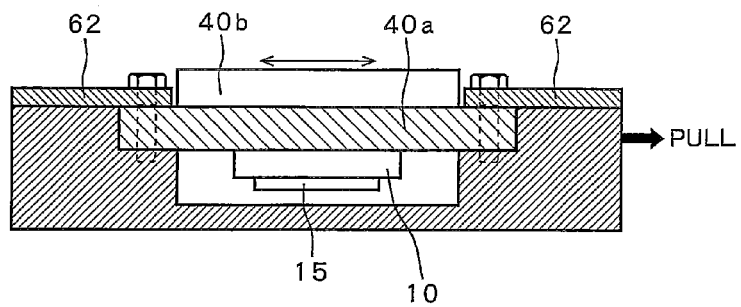
Figure 11:
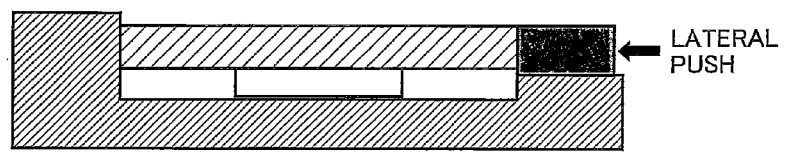
Figure 11:
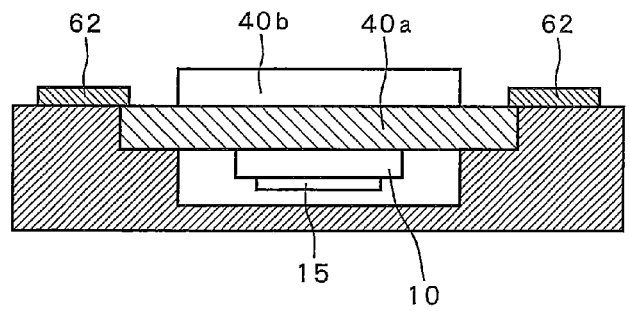

FIG. 11(a) illustrates the clamping method of the sample 31. Pushing the test piece using a pushing jig 61 located below gives a weak tensile stress to facilitate the cutting processing. Further, in the case of a shape projecting downward, the cutting processing can be performed while correcting by the pushing jig 61. FIG. 11(b) illustrates the clamping method of the sample 32 in which case the cutting processing can be performed while correcting using the tensile force, so that the flatness of the heat radiating fins can be improved.

On the other hand, in the clamping method of the comparative example 1 illustrated in FIG. 11(c), if the lateral pushing force is weak, the test piece may scatter by the load during the cutting. Whereas when the lateral pushing force is too strong, the test piece has been sometimes deformed during the cutting. FIG. 11(d) illustrates the comparative example 2 in which the cutting processing can be performed without problem, by changing the lateral pushing clamp as in (c) with clamps 62 from above. However, this method requires attention because the flatness during the casting affects the flatness of the heat radiating fins after the cutting processing, and there is a possibility of occurrence of corrugation in the fins. Further, when a compressive stress is generated in the test piece during the cutting processing, the cutting resistance may increase.

INDUSTRIAL APPLICABILITY

The present invention is applied to a metal-ceramic bonded substrate and, in particular, to a fin-integrated substrate in which a metal circuit board and a metal base plate each made of aluminum or an aluminum alloy are bonded to both surfaces of a ceramic substrate respectively, and plate-like heat radiating fins projecting from a surface of the metal base plate where the ceramic substrate is not bonded and extending at predetermined intervals from each other are integrally formed with the metal base plate, and a manufacturing method thereof.

The invention claimed is:
1. A fin-integrated substrate comprising a metal circuit board made of aluminum or an aluminum alloy that is bonded to one surface of a ceramic substrate, and a metal base plate, wherein one surface of the metal base plate in a flat plate shape made of aluminum or an aluminum alloy is bonded to another surface of the ceramic substrate, the find-integrated substrate further comprising:
   a plurality of heat radiating fins formed integrally with the metal base plate in a manner to project from another surface of the metal base plate and to be arranged at predetermined intervals from each other,
   wherein the metal base plate includes an edger part formed around the plurality of heat radiating fins, wherein a heat conductivity of the metal base plate is 170 W/(m·K) or more,
   wherein a hardness of the metal base plate is a Vickers hardness of 20 to 40 (Hv),
   wherein a width of the heat radiating fin is 0.2 to 2.0 mm,
   wherein a width of a groove part formed between the plurality of heat radiating fins is 0.2 to 2.0 mm,
   wherein a depth of the groove part is 2 to 20 mm,
   wherein a box-shaped liquid cooling type jacket to house the plurality of heat radiating fins therein is provided, and the jacket is attached to the edge part, and
   wherein a width of a groove part formed between the plurality of heat radiating fins is constant is longitudinal direction of the plurality of heat radiating fins, and tip portions of the plurality of heat radiating fins is parallel with a bottom surface of a recess of the jacket in a longitudinal direction of the plurality of heat radiating fins.

2. The fin-integrated substrate according to claim 1,
wherein a thickness of a portion of the metal base plate where the heat radiating fin is not formed is 0.5 to 5 mm.

3. The fin-integrated substrate according to claim 1,
wherein the plurality of heat radiating fins are formed to project in a direction almost vertical to the metal base plate and are almost in parallel with each other.

4. The fin-integrated substrate according to claim 1,
wherein the metal base plate is an aluminum alloy containing at least one element selected from among Si, Mg, Zn, Bi, and Sn, and its crystal grain diameter is 5 mm or less.

5. The fin-integrated substrate according to claim 1,
wherein a crystal grain diameter of the metal base plate is 5 mm or less.

6. The fin-integrated substrate according to claim 1,
wherein an arrangement of the plurality of heat radiating fins is in a zigzag form.

7. The fin-integrated substrate according to claim 1,
wherein the jacket and tip portions of at least a part of the heat radiating fins are bonded together.

8. A manufacturing method of the fin-integrated substrate according to claim 1, the method comprising the steps of:
bonding the metal circuit board to the ceramic substrate, wherein the bonding is performed by a molten metal bonding method, and
forming the plurality of the heat radiating fins and the plurality of grooves at a cut part that is a part of the metal base plate by moving a rotating the multi-cutter composed of a plurality of stacked disc-shaped cutters while applying a tensile stress on a surface of the cut part by fixing the metal plate with a jig.

9. The manufacturing method of a fin-integrated substrate according to claim 8,
wherein the metal circuit board is configured in one body composed of a plate part and a block part projecting near a middle portion of the plate part, and a surface on the block part where the heat radiating fins are to be formed is in a convex shape.

10. The manufacturing method of a fin-integrated substrate according to claim 9,
wherein a middle portion of the block part is thicker than a peripheral portion of the block part.

11. The manufacturing method of a fin-integrated substrate according to claim 8,
wherein rotation blades of the multi-cutter are alternating blades and have a rake angle of 10° or more.

12. The manufacturing method of a fin-integrated substrate according to claim 8,
wherein a cutting speed of the multi-cutter is 700 mm/min or more.

13. The manufacturing method of a fin-integrated substrate according to claim 8,
wherein the jig is in a shape not in contact with the ceramic substrate, and is disposed at a position where the jig does not interfere with deformation of the metal base plate in the grooving processing.

14. The manufacturing method of a fin-integrated substrate according to claim 8,
wherein the jig is a vacuum-suction type, and a suction power thereof is controllable.

15. The manufacturing method of a fin-integrated substrate according to claim 8,
wherein after the grooving processing, a box-shaped liquid cooling type jacket to house the heat radiating fins therein is bonded onto the surface of the metal base plate where the heat radiating fins have been formed.

16. The manufacturing method of a fin-integrated substrate according to claim 15,
wherein the bonding of the metal base plate and the jacket is brazing.

17. The manufacturing method of a fin-integrated substrate according to claim 15,
wherein tip portions of at least a part of the heat radiating fins and the jacket are bonded together.

18. The manufacturing method of a fin-integrated substrate according to claim 15,
wherein a part of the jacket where the heat radiating fin tip portions and the jacket are bonded together is thin as compared to another part.

19. The manufacturing method of a fin-integrated substrate according to claim 15, wherein the jacket is brazed to the edge part.

20. The manufacturing method of a fin-integrated substrate according to claim 15, wherein the jacket is screwed to the edge part via O-ring.

21. The manufacturing method of a fin-integrated substrate according to claim 8,
wherein a width of the heat radiating fin is 0.3 to 1.5 mm.

22. The manufacturing method of a fin-integrated substrate according to claim 8,
wherein a width of a groove part formed between the plurality of heat radiating fins is 0.5 to 2.0 mm.

23. The manufacturing method of a fin-integrated substrate according to claim 8,
wherein a depth of the groove part is 3 to 15 mm.

* * * * *